United States Patent
Liu et al.

(10) Patent No.: US 6,299,498 B1
(45) Date of Patent: Oct. 9, 2001

(54) WHITE-LIGHT EMITTING DIODE STRUCTURE AND MANUFACTURING METHOD

(76) Inventors: Shin Lung Liu, No. 109, Shih Kang Tzu, lin 10, Shin Kuang Li, Kuan Hsi Cheng, Hsinchc Hsien; Asar Shiau, No. 7, Lane 143, Sec. 2, Kuang Fu Rd., San Chung City, Taipei Hsien, both of (TW)

( * ) Notice: Subject to any disclaimer, the term of this patent is extended or adjusted under 35 U.S.C. 154(b) by 0 days.

(21) Appl. No.: 09/428,289

(22) Filed: Oct. 27, 1999

(51) Int. Cl.$^7$ .................................................. H01L 33/00
(52) U.S. Cl. .............................................................. 445/24
(58) Field of Search ...................... 445/24, 22; 313/512

(56) References Cited

U.S. PATENT DOCUMENTS

| | | | |
|---|---|---|---|
| 5,847,507 | * 12/1998 | Butterworth | 313/512 |
| 5,959,316 | * 9/1999 | Lowery | 257/98 |
| 5,962,971 | * 10/1999 | Chen | 313/512 |
| 5,998,925 | * 12/1999 | Shimitzu | 313/503 |

* cited by examiner

*Primary Examiner*—Kenneth J. Ramsey
(74) *Attorney, Agent, or Firm*—Pro-Techtor International Services

(57) ABSTRACT

A manufacturing method and structure of white-light emitting diode. The chip is placed in a diode bowl doped with fluorescent glue. The bowl is then placed in a baking oven. After the baking, gold wire is respectively attached to diode pins on the bird's-eye side of the chip where not doped with fluorescent glue. Finally, the chip is masked with white light insulation glue for baking once more. It facilitates manufacturing process, increases output and improves production QC. Furthermore, the chip does not required conductive silver glue to be baked together in the bowl, so the conductive silver glue will not affect its light emission. The direct emission of color light is effectively prevented since the section not doped with fluorescent glue on the bird's-eye side is masked with white light insulation glue, in turn, light-emitting effect and brightness of white light becomes more stable.

4 Claims, 4 Drawing Sheets

WHITE-LIGHT EMITTING DIODE STRUCTURE AND MANUFACTURING METHOD

BACKGROUND OF THE INVENTION

1. Field of the Invention

The present invention relates to a product of white-light emitting diode which requires only two rounds of baking, and more particularly to a manufacturing process of the white-light emitting diode. The process offers advantages of facilitating process, increasing output and effectively controlling product quality; and the product itself gives good emitting quality and stable white light emitting effect.

2. Description of the Prior Art

The ever improving process of an LED allows the production from a large size face panel, LED applications, such as Xmas tree lighting, flashlight and traffic sign, grow fast by year and the market place of the diode industry also enjoys rapid expansion. As illustrated in FIG. 1, in the structure of a white-light emitting diode manufactured by the process of the prior art of the present invention, a light-emitting chip (2) is attached to a bowl (13) of a diode (1) with a conductive silver glue (3), then baked for two hours in an oven at the temperature of 150° C. and secured in position. Gold wire (5) is used to respectively butted to diode pins (11, 12) then the entire chip (2) is masked with fluorescent glue (4) baked for two hours at 140° C. The entire process takes four working hours. Longer hours means being vulnerable to produce the defective ones. In addition, the process requires that the mask area of conductive silver glue (3) not to be greater than one third of the light emitting chip (2) since the greater mask area will affect the white-light emitting quality of the entire white-light emitting diode; as a result, the number of inferior quality products beyond the tolerance.

Another prior art of the present invention requires three rounds of baking process. As illustrated in FIG. 2, the light emitting chip (2) is attached in the bowl (13) of the diode (1) with the conductive silver glue (3) and baked for two hours in the oven at 150° C. When secured, the gold wire (5) is used to respectively butt the pins (11 and 12) from two electrodes and the entire light-emitting chip (2) is masked with transparent glue (6) to be baked again for two hours in the oven at 150° C. When secured, and the upper layer of the entire light-emitting chip (2) is coated with fluorescent glue (4) to be bonded in the oven at 150° C. for one hour. The entire process takes three rounds of baking and five working hours to complete. The same defectives as discussed in the first prior art are found in this process, too.

So far it is impossible to produce a white-light emitting diode by causing a light-emitting chip to directly create white-light. Each color light gives own spectrum characteristics at particular wavelength. The present invention achieves white-light emitting effect by having the color light from the LED chip to emit through fluorescent glue at given wave length to incorporate both wave lengths of the color light and that from the LED chip into the range of that of white light.

SUMMARY OF THE INVENTION

The primary objective of the present invention is to provide a manufacturing process of white-light emitting diode that requires only two rounds of baking to facilitate production, increase output and achieve effective QC.

Another objective of the present invention is to provide a product of white-light emitting diode that does not require binding the LCD with conductive silver glue so that light emitting effect will not be affected, and that the white-light emitting effect is given higher brightness and more stable.

DETAILED DESCRIPTION OF THE INVENTION

Figure 1:
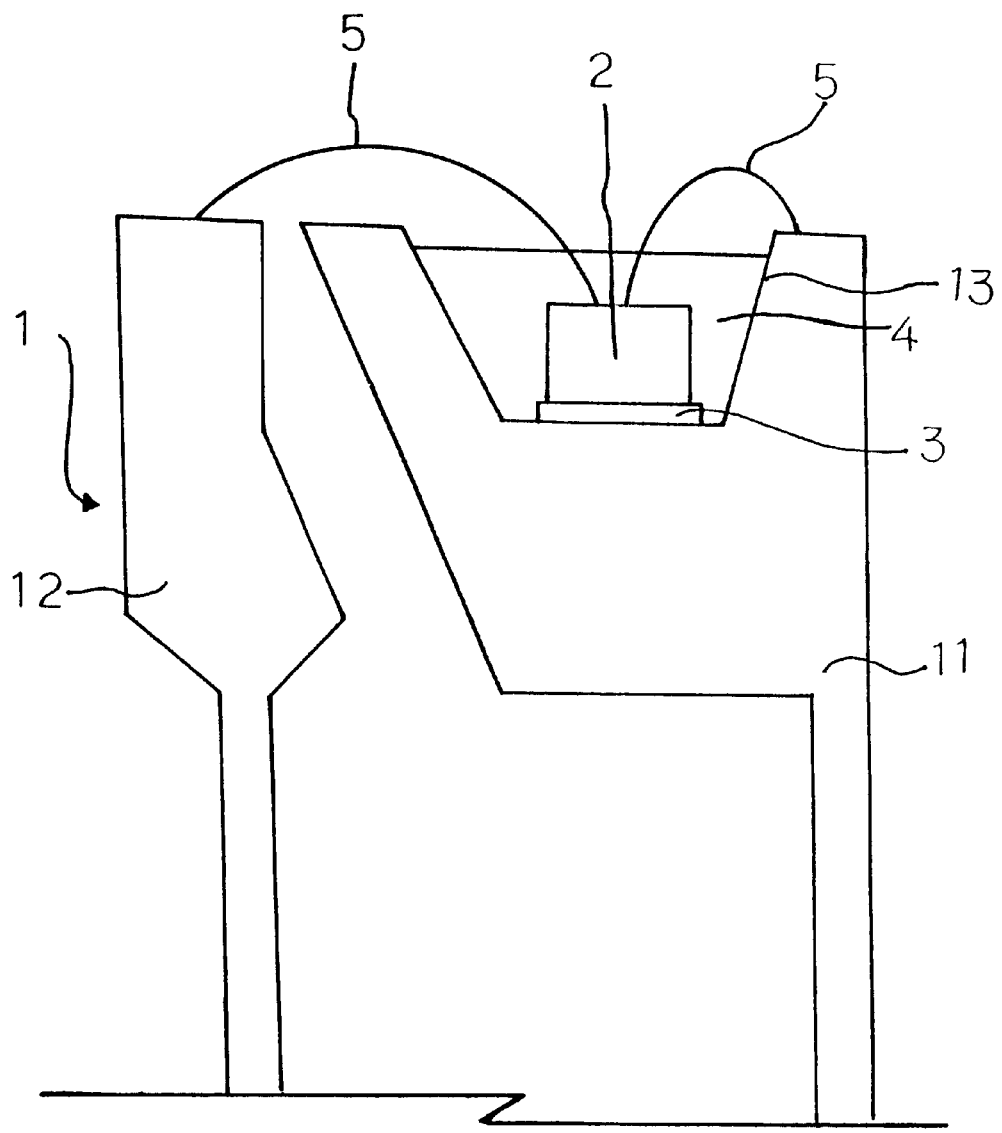
FIG. 1 is a schematic view showing a structure of a white-light emitting diode manufactured with the prior art of the present invention.
Figure 2:
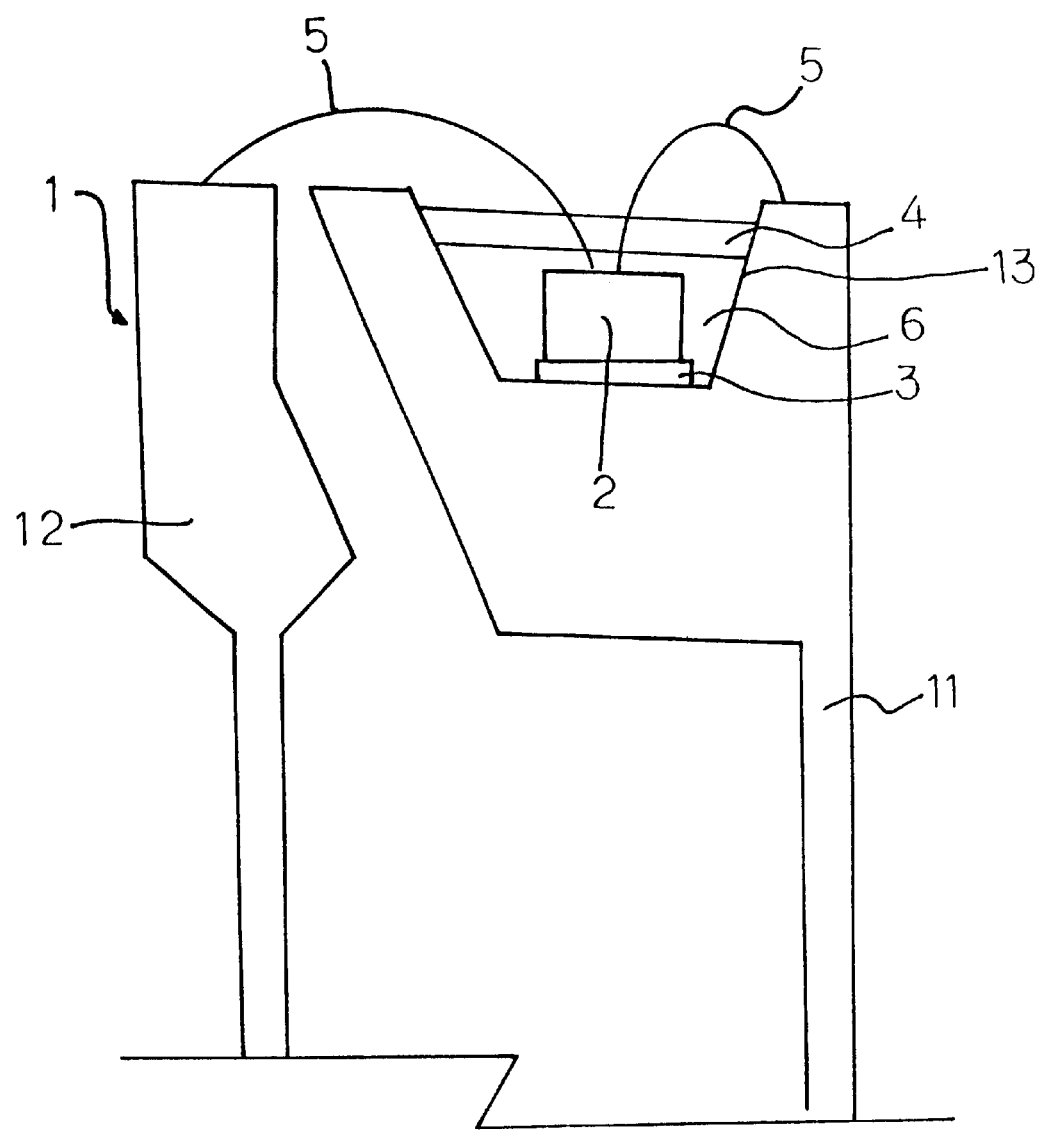
FIG. 2 is a schematic view showing another structure of a white-light emitting diode manufactured with the prior art of the present invention.
Figure 3:
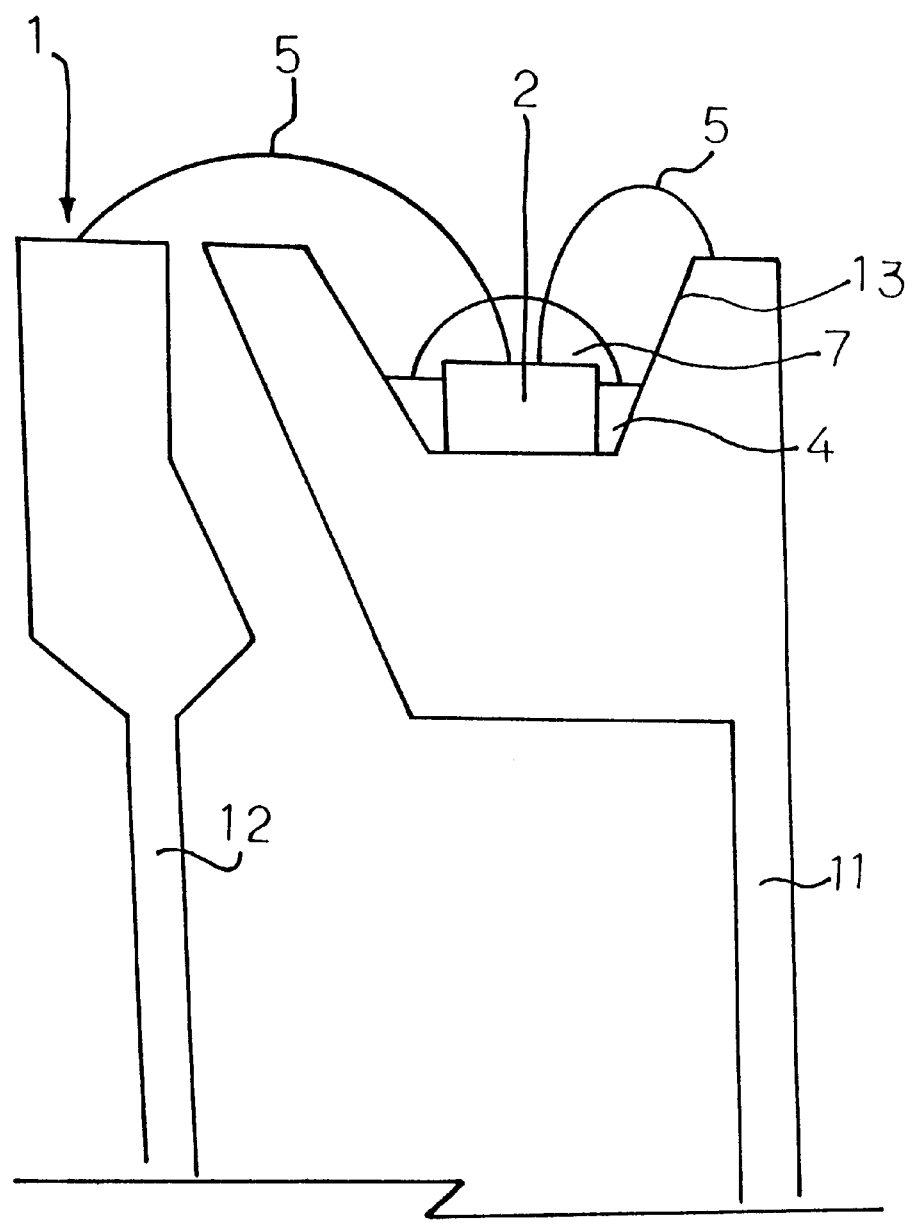
FIG. 3 is a schematic view showing a preferred embodiment of the present invention.
Figure 4:
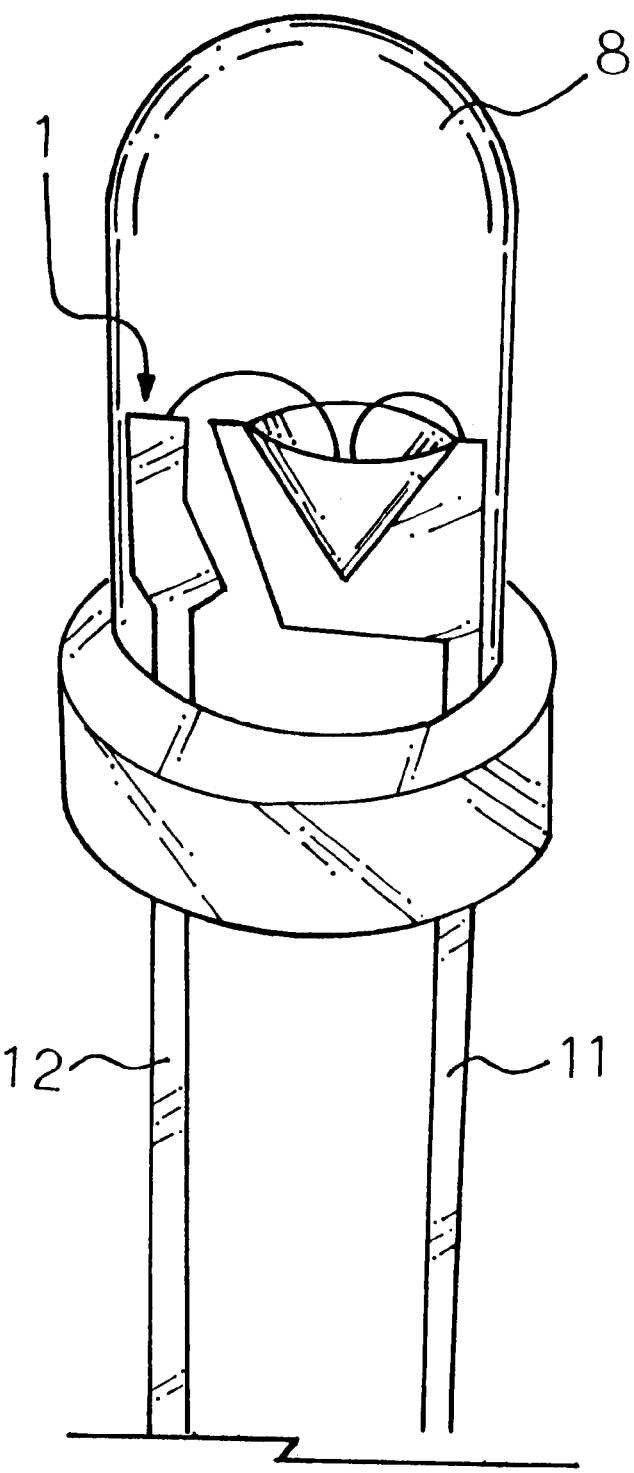
FIG. 4 is a view of the appearance of the entire structure of a white-light emitting diode of the present invention.

Referring to FIG. 3 showing the primary structure of a white-light emitting diode produced with the methodology disclosed by the present invention. Within, a fluorescent glue (4) is doped in a bowl (13) of the diode (1), and a light-emitting chip is secured in the fluorescent glue (4); gold wire (5) is used to butt the light-emitting diode (2) and both pins (11, 12) from the diode (1). A white-light insulation glue (7) is used to mask where the gold wire (5) of the light-emitting chip (2) is butted. Then the outer surface of the light-emitting chip (2) is coated with fluorescent glue (4) to allow color lights generated by the light-emitting chip (2) emit through the fluorescent glue (4) with a certain wavelength. Both wavelengths from the light-emitting chip (2), and the fluorescent glue (4) are incorporated into that falls within the spectrum of a white light to present the effect of emitting white light.

The manufacturing process of the white-light emitting diode involves the placement of the light-emitting chip (2) in the fluorescent glue (4) doped in the bowl (13) of the diode (1) and baked for one hour in an oven at 130° C. to bond the fluorescent glue (4) to the light-emitting chip (2). Then gold wire (5) is used to respectively butt both pins (11 and 12) from the diode (1) and masked with the white-light insulation glue (6) to be baked for one hour in the oven at 150° C. The final product must be protected with a see-through cover. The entire process of the present invention for taking only two rounds of baking to complete production of a white-light emitting diode is able to shorten the process, increase output and achieve effective QC.

Since the conductive silver glue is not required in the present invention to bond to the chip in the diode bowl, the light emitting performance of the chip in the white-light emitting diode will not be affected. Furthermore, the bird's-eye side of the chip where not doped with fluorescent glue is masked with white-light insulation glue to effectively prevent the direct emission of color light from the chip. Consequently, the white-light emitting effect and its brightness are more stable and product quality is upgraded.

What is claimed is:

1. A method of manufacturing a white-light emitting comprising the following steps:

a) doping a fluorescent glue in a bowl of a diode;

b) securing a light-emitting chip in said fluorescent glue;

c) baking said light-emitting chip and said diode in an oven to cure said fluorescent glue, thereby ensuring anchoring of said light-emitting chip in said diode;

d) connecting said light-emitting chip to two pins of said diode with gold wire; and e) using white-light insulation glue to mask connection points of said gold wire and said light-emitting chip.

2. The method of claim 1, wherein:

said light-emitting chip and said diode with said fluorescent glue therein are baked in said oven for one hour.

3. The method of claim 1, wherein:

said white-light insulation glue is baked in said oven for one hour.

4. The method of claim 1, wherein:

an external see-through cover is added to cover said light-emitting chip and said diode.

* * * * *